United States Patent [19]

Zarabadi et al.

[11] Patent Number: 5,073,975
[45] Date of Patent: Dec. 17, 1991

[54] STOP ON STATION CIRCUIT INCLUDING CENTER CHANNEL DETECTOR

[75] Inventors: Seyed R. Zarabadi, Columbus, Ohio; Myron G. Padgett, Greentown; Richard A. Kennedy, Russiaville, both of Ind.

[73] Assignee: Delco Electronics Corporation, Kokomo, Ind.

[21] Appl. No.: 399,948

[22] Filed: Aug. 28, 1989

[51] Int. Cl.⁵ .......................................... H04B 1/16
[52] U.S. Cl. .................... 455/161; 455/168; 455/177; 455/182; 455/200
[58] Field of Search ............. 455/150, 160, 161, 164, 455/166, 168, 177, 200, 182, 226

[56] References Cited

U.S. PATENT DOCUMENTS

| | | | |
|---|---|---|---|
| 4,298,989 | 11/1981 | Someno et al. | 455/183 |
| 4,406,018 | 9/1983 | Motohashi | 455/164 |
| 4,556,987 | 12/1985 | Schlösser | 455/161 |
| 4,580,285 | 4/1986 | Richards, Jr. | 455/161 |
| 4,903,328 | 2/1990 | Ichikawa | 455/165 |

FOREIGN PATENT DOCUMENTS 0336650 10/1980 European Pat. Off. .

Primary Examiner—Curtis Kuntz
Assistant Examiner—Chi H. Pham
Attorney, Agent, or Firm—Albert F. Duke

[57] ABSTRACT

A Stop On Station (SOS) circuit for a AM and FM radio receivers evaluates field strength of a received station signal and in addition measures and evaluates the frequency of the IF signal so as to assure that the received signal is essentially centered at the IF frequency to identify candidate stations signals which are suitable for listening. The IF frequency for a received candidate station signal is evaluated for an evaluation period of time (e.g., for 40 milliseconds). During each 40 millisecond period, fifteen samples of the frequency of the IF signal are counted and evaluated. If the frequency of the measured signal falls within acceptable limits, a four stage binary persistence counter is incriminated. If a count of 12 or more out of the 15 possible counts is accumulated therein during a 40 ms evaluation period, a station signal is considered to be suitable from a standpoint of received frequency and a "frequency pass" signal is generated. The SOS circuit, in turn, generates a "Stop" signal if the AGC signal is above a predetermined threshold at the time the pass signal occurs. In this case of FM signals, the magnitude of ultrasonic noise (noise in the range of 100 kHz to 200 kHz) in the output of the FM detector is measured and used to identify acceptable station signals. Noise above a threshold value eliminates a station signal from consideration.

4 Claims, 3 Drawing Sheets

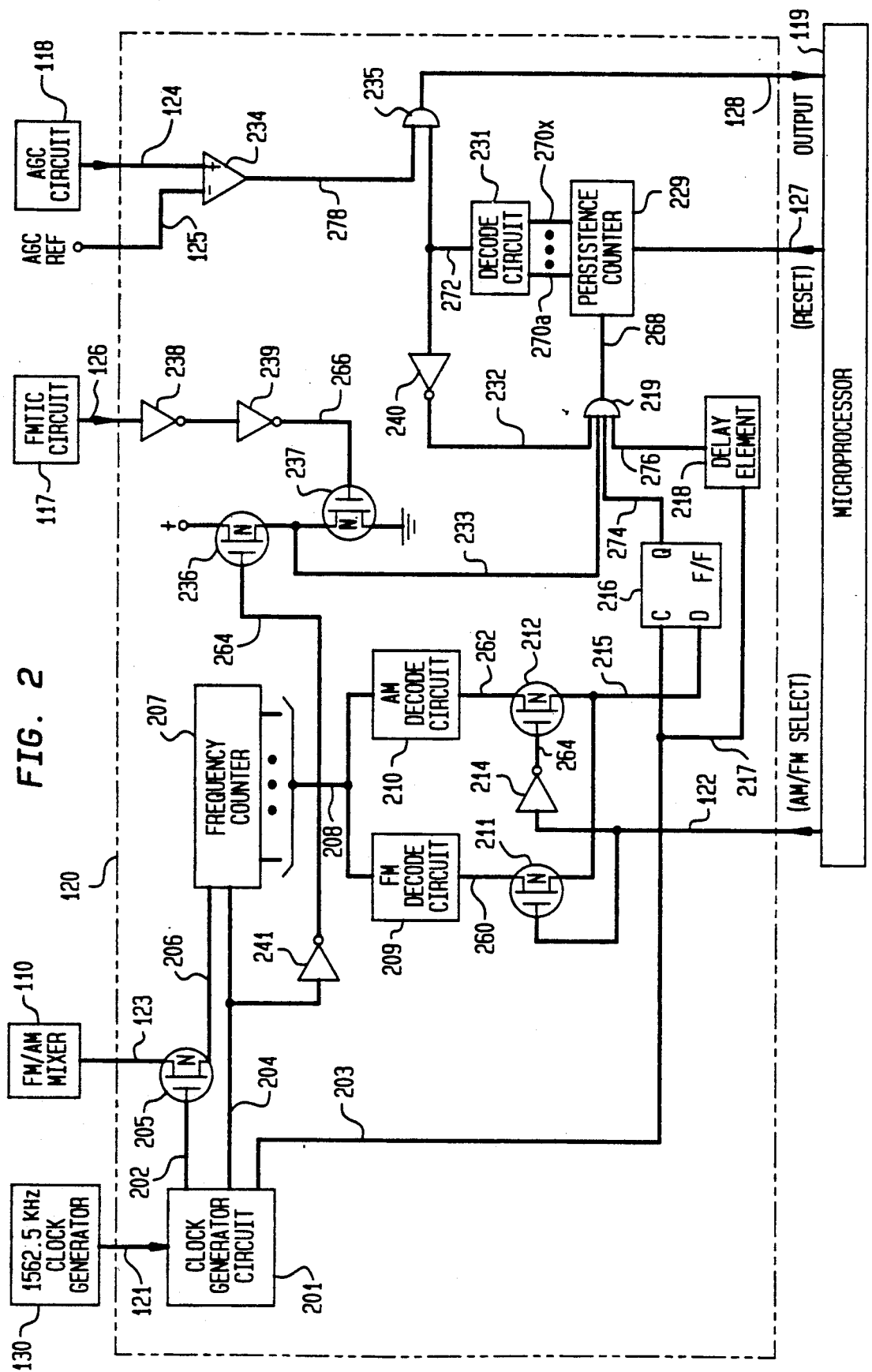

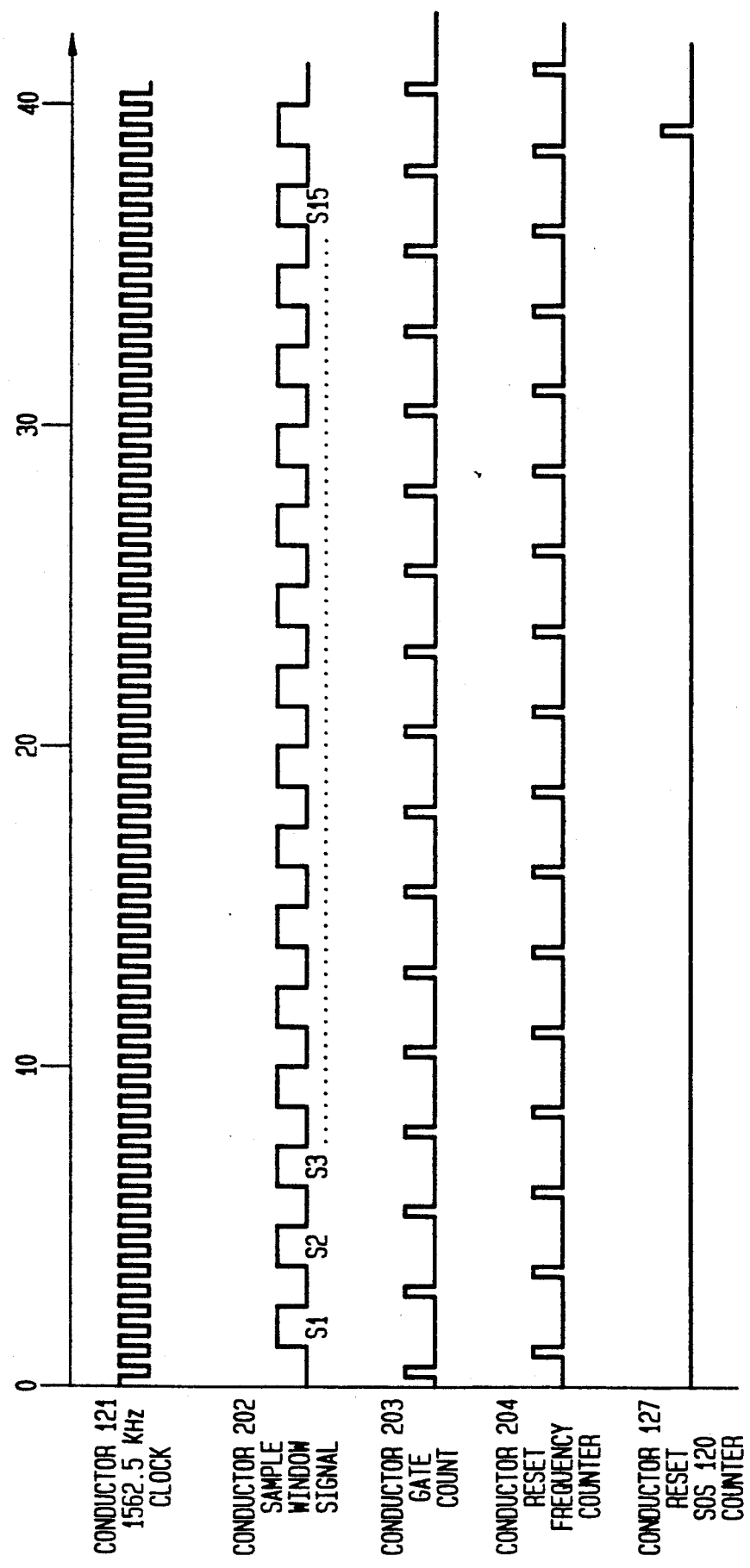

STOP ON STATION CIRCUIT INCLUDING CENTER CHANNEL DETECTOR

FIELD OF INVENTION

This invention relates to an improved stop on station circuit for an AM or FM radio receiver.

BACKGROUND OF THE INVENTION

Many modern radio receivers provide "seek" and "scan" features which are respectively initiated by depression of seek and scan buttons. In response to a request for either of these features, the radio receiver searches for the next station signal that meets certain criteria. In the case of a "seek" request, the receiver terminates the search when a suitable station signal is found; and in the case of "scan" request, the receiver temporarily locks on a station signal that meets the criteria to permit a listener to preview the current program. The listener can terminate the scan by again depressing the scan button. If the listener does not terminate the scan, the receiver searches and locks onto candidate station signals for short preview periods of time and terminates the scan when the end of the frequency band is reached.

Prior art Stop on Station (SOS) circuits use essentially received field strength to determine if a received radio (station) signal is acceptable for listening or not. These prior art SOS circuits which evaluate the field strength of received station signals are generally termed "AGC" for Automatic Gain Control. Since received signal strength may vary substantially within short periods of time, prior art SOS circuits may stop on radio station signals which are inadequate for good listening or may pass over signals which are in fact acceptable for listening. Variation in received signal strength is typically more noticeable in automobile radios than home receivers.

SUMMARY OF THE INVENTION

The present invention is directed to Stop On Station (SOS) circuits for use with a radio receiver. The SOS circuit of the present invention evaluates the field strength of a received signal and in addition evaluates one or more additional parameters of a received station signal to identify candidate stations signals which are suitable for listening. In the case of AM and FM radio signals, the frequency of an Intermediate Frequency (IF) signal (e.g., the second IF signal in the receiver) is measured and evaluated so as to assure that the received signal is essentially centered at the second IF frequency.

In the illustrative embodiment, the IF frequency for a received candidate radio signal is evaluated for a period of time, typically in one illustrative embodiment for 40 milliseconds. During each 40 millisecond (ms) period, several samples of the frequency of the IF signal, 15 samples in the illustrative embodiment, are counted and evaluated. If the frequency of the measured signal falls within acceptable limits, a four stage binary persistence counter of the SOS circuit is incremented. If a count of 12 or more out of the 15 possible counts is accumulated therein during a 40 ms evaluation period, a received radio signal is considered to be suitable from a standpoint of received frequency and a "frequency pass" signal is generated by the SOS circuit. The receiver also generates an Automatic Gain Control (AGC) signal which is coupled to an input of the SOS circuit. The SOS Circuit generates a lock on (stop, hold) signal if the AGC signal is above a predetermined threshold at the time the pass signal occurs. This locks onto a candidate radio signal which has just been evaluated and has been found to be acceptable for listening. If the AGC signal is below the preselected threshold at the time the pass signal occurs, the SOS Circuit rejects the candidate radio signal just evaluated and causes the radio receiver to evaluate another candidate radio signal.

In the case of FM signals, the magnitude of ultrasonic noise (noise in the range of 100 kHz to 200 kHz) in the output of an FM detector of the receiver is measured and serves as another input to the SOS circuit. Noise above a threshold value results in the SOS circuit generating a non-select signal which eliminates a particular candidate radio signal just evaluated from consideration for listening.

The invention will be better understood from the following more detailed description taken with the accompanying drawings and claims.

BRIEF DESCRIPTION OF THE DRAWING

FIG. 2 is a schematic and block diagram of the SOS circuit of FIG. 1 in accordance with an embodiment of the present invention; and FIG. 3 illustrates several timing signals used with and/or generated by the SOS circuit of FIG. 2.

DESCRIPTION OF THE PREFERRED EMBODIMENT

Figure 1:
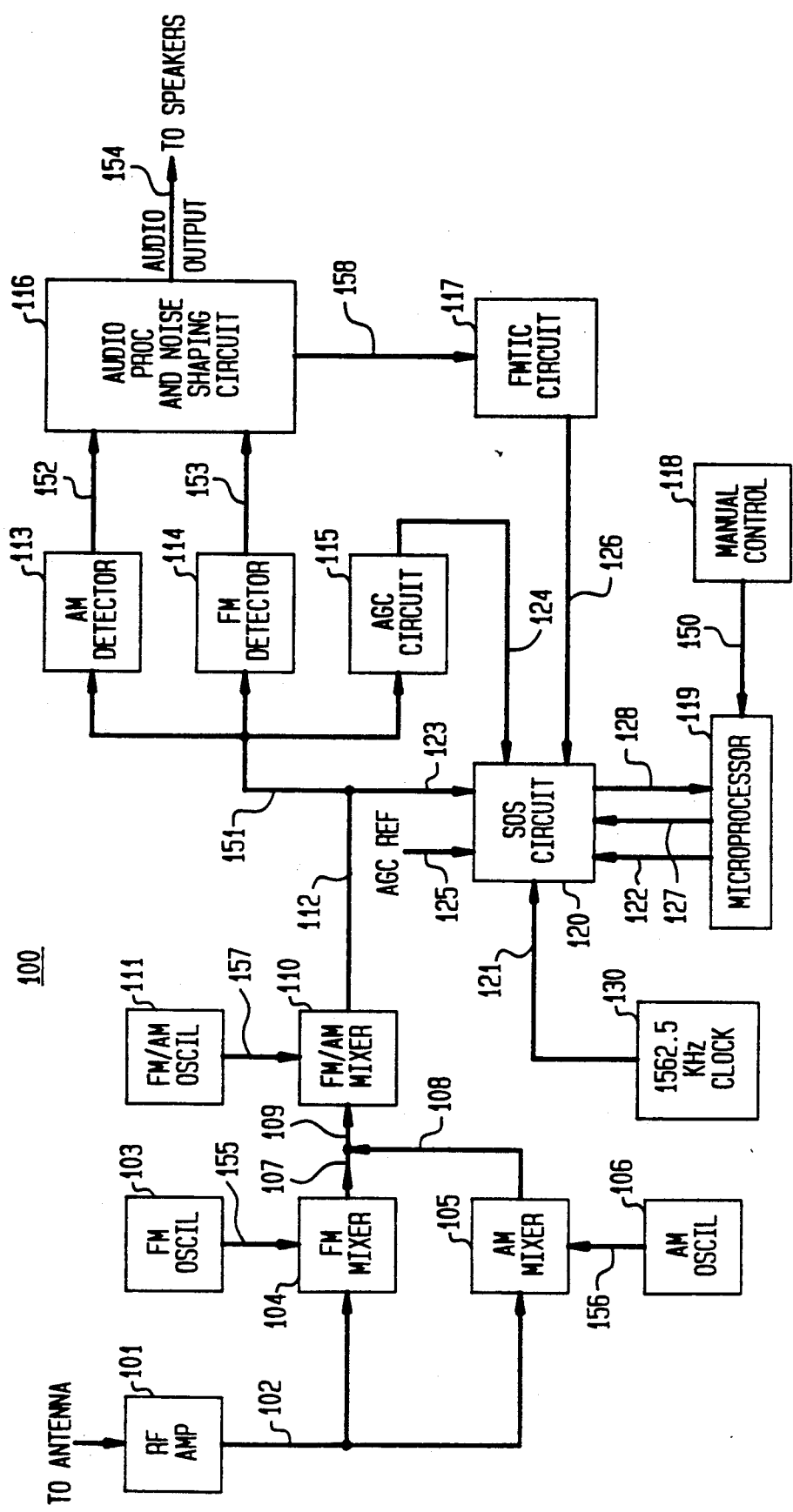
FIG. 1 is a block diagram of an AM/FM radio receiver with a Stop on Station (SOS) circuit in accordance with the present invention.

Referring to FIG. 1, there is shown a AM/FM radio receiver 100 in accordance with an embodiment of the present invention. Receiver 100 comprises a Stop On Station (SOS) circuit 120 and in addition comprises radio frequency amplifier (shown as RF Amp) 101, a frequency modulation oscillator (shown as FM Oscil) 103, a frequency modulation mixer (shown as FM Mixer) 104, an amplitude modulation mixer (shown as AM Mixer) 105, an amplitude modulation oscillator (shown as AM Oscil) 106, a frequency modulation/amplitude modulation oscillator (shown as FM/AM Oscil) 111, a frequency modulation/amplitude modulation mixer (shown as FM/AM Mixer) 110, a fixed frequency generator (shown as 1562.5 Hz Clock) 130, a microprocessor 119, a manual control 118, an amplitude modulation detector (shown as AM Detector) 113, a frequency modulation detector (shown as FM Detector) 114, an automatic gain control circuit (shown as AGC Circuit) 115, an audio processor and signal shaping circuits (shown as Audio Proc) 116 and a ultra sonic noise signal generating circuit (shown as FMTIC circuit) 117. FMTIC circuit 117 provides an output representative of impulse and automobile ignition noise. SOS circuit 120 is adapted to rapidly perform multiple tests on an intermediate frequency (IF) of a radio frequency (RF) received by an antenna (not shown) coupled to RF Amp 101 and to accept the incoming RF signal and to select (allow it to be heard) or to deselect (reject) it.

Only principal signal paths and functional blocks of AM/FM radio receiver 100 are shown. Features such as filters and control signal paths are not shown. Manual control 118 comprises controls for selecting AM or FM radio stations, initiating seek and scan operations, determining tone characteristics, controlling volume etc.

RF signals generated by radio stations are received on an antenna (not shown) coupled to RF Amp 101 and are amplified by RF Amp 101. These amplified radio signals are coupled via a conductor 102 to FM Mixer 104 and to AM Mixer 105. An output of FM Oscil 103 is coupled to an input of FM Mixer 104 via a conductor 155. An output of AM Oscil 106 is coupled to an input of AM Mixer 105 via a conductor 156. Outputs of FM Mixer 104 and AM Mixer 105 are coupled via conductors 107 and 108, respectively, to a conductor 109 which is coupled to an input of FM/AM Mixer 110. A manual selector (not shown) coupled to FM Mixer 104 and to AM Mixer 105 determines whether FM Mixer 104 or AM Mixer 105 is selected and activated.

An output of FM/AM Mixer 110 is coupled via a conductor 112 to a conductor 123 which is coupled to a first input of SOS circuit 120 and to a conductor 151 which is coupled to inputs of AM Detector 113, FM Detector 114 and AGC circuit 115. An output of AM Det 113 is coupled to an input of Audio Proc 116 via a conductor 152. An output of FM Det 114 is coupled via a conductor 153 to an input of audio processing and noise shaping circuits 116. An audio output of audio processing and noise shaping circuits 116 is coupled to speakers (not shown) via a conductor 154. A noise output of audio processing and noise shaping circuits 116 is coupled to an input of FMTIC 117 via a conductor 158. An output of AGC circuit 115 is coupled via a conductor 124 to a second input of SOS Circuit 120. An output of FMTIC Circuit 117 is coupled via a conductor 126 a third input of SOS Circuit 120. First and second outputs of microprocessor 119 are coupled via conductors 122 and 127, respectively, to fourth and fifth inputs of SOS circuit 120. 1562.5 kHz clock 130 is coupled via a conductor 121 to a sixth input of SOS Circuit 120. A reference AGC voltage (AGC Ref) is coupled to a seventh input of SOS Circuit 120 via a conductor 125. An output of SOS Circuit 120 is coupled via a conductor 128 to microprocessor 119.

With FM Mixer 104 selected and activated, an FM radio frequency signal is mixed with an output of FM Oscil 103 by FM Mixer 104 and a first intermediate frequency (1st IF) signal centered at a selected frequency (e.g., 10.7 MHz) is generated by FM Mixer 104 on conductor 107 and is coupled to FM/AM Mixer 110 via conductor 109. An output of manual control 118 is coupled via a conductor 150 to a first input of microprocessor 119. Typically FM oscil 103 is tuned to operate at 10.7 MHz above the frequency of a selected radio station. Tuning of FM Oscil 103 is controlled by signals from microprocessor 119.

With AM Mixer 105 selected and activated, an AM radio frequency signal is mixed with an output from AM Oscil 106 by AM Mixer 105 and an amplitude modulated (AM) first Intermediate Frequency (IF) signal centered at a preselected frequency (e.g., 10.7 MHz) is generated on conductor 108 that is coupled to conductor 109 which is coupled to FM/AM Mixer 110. FM/AM Mixer 110 converts the AM modulated IF signal to a modulated 450 kHz signal which it generates on the conductor 112. Tuning of AM Oscil 106 is controlled by signals from microprocessor 119.

The second IF signal generated by FM/AM Mixer 110 is detected by AM Det 113 or FM Det 114, (depending on whether it is an AM or FM signal) whose outputs are coupled to Audio Proc 116 which generates a audio output signal which is delivered to speakers (not shown).

SOS Circuit 120 generates on the output coupled to conductor 128 a signal which indicates if a received candidate radio frequency signal at the input of RF Amp 101 is acceptable for listening to or not. If the received radio frequency signal is acceptable, microprocessor 119 controls other components of FM/AM receiver 10 such that the received signal is locked onto. If not, microprocessor 119 rejects that particular received signal and adjusts other components of FM/AM receiver 10 to select another radio frequency signal which is then subsequently tested by SOS circuit 120.

An illustrative embodiment of an SOS circuit 120 is shown within the dashed line in block and electrical schematic form in FIG. 2. The SOS circuit 120 comprises a clock generator circuit 201, n-channel field effect transistors 205, 211, 212, 236 and 237, a ten bit frequency counter 207, inverters 214, 238, 239, 240 and 241, FM decode circuit 209, AM decode circuit 210, and D-type flop-flop 216, a delay element 218, a two input comparator 234, a four input AND gate 219, a two input AND gate 235, a decode circuit 231 and a four bit persistence counter 229.

Clock circuit 201 has an input coupled to an output of the 1562.5 kHz clock generator 130 which generates a 1562.5 kHz square waveform which is shown in graphical form in FIG. 3 as the top waveform. Clock circuit 201 has first, second and third outputs which are coupled to conductors 202, 203, and 204 respectively. The voltage waveforms generated by clock circuit 201 onto conductors 202, 203 and 204, respectively, are shown graphically in FIG. 3 as the second, third and fourth waveforms, respectively, from the top. Conductor 202 is coupled to the gate of n-channel Metal-Oxide-Semiconductor (MOS) transistor 205. Conductor 203 is coupled to a clock input (C) of flip-flop 216 and to a first terminal of delay element 218. Conductor 204 is coupled to a control input of frequency counter 207 and to an input of inverter 241. A drain of transistor 205 is coupled through the conductor 123 to the output of FM/AM Mixer 110. Outputs of frequency counter 207 are coupled via conductor 208 to FM decode circuit 209 and to AM decode circuit 210. An output of FM decode circuit 209 is coupled via a conductor 260 to a drain of transistor 211. An output of AM decode circuit 210 is coupled via a line 262 to a drain of transistor 212. The sources of transistors 211 and 212 are coupled via a conductor 215 to a D-input of flip-flop 216. An AM/FM select output of microprocessor 119 is coupled via the conductor 122 to a gate of transistor 211 and to an input of inverter 214. An output of inverter 214 is coupled via a conductor 264 to a gate of transistor 212

Each time the voltage waveform on conductor 202 goes to a high level, a "1", which occurs 15 times during each 40 millisecond time period, transistor 205 becomes enabled (biased on) and a sample of the second IF signal of FM/AM mixer 110 passes through a drain-source of transistor 205 and becomes an input to frequency counter 207. The sample period of frequency counter 207 is illustratively 1.28 milliseconds. In the case of a 450 khz IF signal, the ten bit counter 207 accumulates a count of 576 in a 1.28 millisecond sample time period. Counter 207 is reset by a high (a "1") "reset frequency counter" signal on conductor 204. This reset signal, which is graphically shown as the fourth from the top waveform of FIG. 3, occurs at a rate of once every 2.56 milliseconds. The sample period of counter 207 of 1.28 milliseconds occupies the first half of the 2.56 millisecond period. During the second 1.28 milliseconds each of each 2.56 millisecond period, one of decode circuits 209 or 210 is biased on and the other is biased off. An output signal from the biased on decode circuit 209 or 210 is coupled through transistor 211 or transistor 212 to the D-input of flip-flop 216. If FM decode circuit 209 is to be biased on, the AM/FM select output of microprocessor 119 causes conductor 122 to be a high, a "1", which enables transistor 211 and disables transistor 212. If AM decode circuit 210 is to be biased on, conductor 122 is biased by microprocessor 119 to a low, a "0", which enables (biases on) transistor 212 and disables (biases off) transistor 211.

An output of inverter 241 is coupled to a gate of transistor 236 via a conductor 264. A drain of transistor 236 is coupled to a positive voltage source shown by a "+" sign. A source of transistor 236 is coupled to a drain of transistor 237 and to a first input of AND gate 219 via a conductor 233. The series combination of inverters 238 and 239 form a buffer circuit with the output of same (the output of inverter 239) being coupled to a gate of transistor 237 via a conductor 266. An output of the FMTIC circuit 117 is coupled to the input of the buffer (the input of inverter 238) via the conductor 126. An end of cycle output (reset) of microprocessor 119 is coupled to a reset input of the four bit persistence counter 229 via the conductor 127. An information input of counter 229 is coupled to an output of AND gate 219 via a conductor 268. Outputs of counter 229 are coupled to inputs of decode circuit 231 via conductors 270a through 270x. An output of decode circuit 231 is coupled to an input of inverter 240 and to a first input of AND gate 235 via a conductor 272. An output of inverter 240 is coupled to a second input of AND gate 219 via a conductor 232. A Q-output of flip-flop 216 is coupled to a third input of AND gate 219 via a conductor 274. A second terminal of delay element 218 is coupled to a fourth input of AND gate 219 via a conductor 276. An automatic gain control reference voltage (AGC REF) is coupled to a negative input terminal of the comparator 234. An output of AGC circuit 115 is coupled to a positive input of comparator 234 via the conductor 124. An output of comparator 234 is coupled to a second input of AND gate 235 via a conductor 278. An output of AND gate 235, which is the output of SOS Circuit 120, is coupled to a input of microprocessor 119 via the conductor 128.

A high, a "1", on conductor 204, after inversion by inverter 241, disables transistor 236 and thus leaves conductor 233 at a near ground potential which is a low (a "0"). This "0" input to the second input of AND gate 219 effectively disables AND gate 219 (i.e., the output thereof is a "0" independent of the levels of the signals applied to the other three inputs thereof). Thus when conductor 204 is a "1", which represents the time period used when frequency counter 207 is reading out to decode 209 or 210 and does not accept new information from FM/AM mixer 110, AND gate 219 is disabled. When the signal on the conductor 203 is a "1", flip-flop 216 is enabled (clocked on) and a signal from decode 209 or 210 can change the Q-output of flip-flop 216. Decode circuit 209 or 210 generate a high output signal, a "1", at the output terminals thereof if the measured frequency by frequency counter 207 is within defined limits. Otherwise they generate a "0".

In the case of an AM signal, the received radio frequency (station) signal is acceptable if the IF signal is 450 kHz plus or minus 750 Hz. In a 1.28 millisecond sample period, a 750 Hz deviation from 450 kHz results in a count from frequency counter 207 of 1 above or below the center frequency count of 576. Accordingly, AM decode circuit 210 generates a high signal, a "1", if the count in the counter is between 575 and 577.

In the case of an FM signal, the received radio frequency (station) signal is acceptable if the IF signal is 450 kHz plus or minus 50 kHz. In a 1.28 millisecond sample period, a 50 kHz deviation results in a count from frequency counter 207 of 64 above or below the center frequency count of 576. Accordingly, FM decode circuit 209 generates a high signal, a "1", if the count in counter 207 is between 512 and 640.

If the selected output of decode circuit 209 or 210 is high at the occurrence of the "gate count" signal, a "1", on conductor 203, flip-flop 216 is set to the "1" state and a high signal, a "1", occurs on the conductor 274. The "gate count" signal, on conductor 203, delayed by delay circuit 218, is a fourth input to AND gate 219; and the output of flip-flop 216 on conductor 240 is a third input to AND gate 219. The signal on conductor 233 is a second input to AND gate 219; and the inverted output (from inverter 240) of decode 231 is the first input to the AND gate 219.

In the case of receiving an FM radio frequency signal, the signal on conductor 233 is selectively a "1" if there is an acceptable level of noise, i.e., the output of FMTIC is a "0". If there is an unacceptable amount of noise then the output of FMTIC circuit 117 is a "1" and the conductor 233 is at a "0" level.

When receiver 100 receives an AM radio signal the output of FMTIC is held low, a "0". This insures that conductor 233 stays a "1" when transistor 236 is based on. This allows AND gate 219 to respond to the signal from the Q-output of flip-flop 216.

If FMTIC 117 generates a high, a "1", onto conductor 126, then transistor 237 becomes enabled (biased on) and the conductor 233 is pulled close to ground potential which is a "0". A "1" on conductor 126 indicates that the noise level unacceptable. A "0" on conductor 233 disables AND gate 219 such that the output thereof is a "0", independent of signals applied to the other three inputs thereof. If the noise level is within acceptable limits then FMTIC 117 generates a low, a "0", and transistor 237 is biased off. Thus conductor 233 stays at a "1" level when conductor 204 is at a "0" since transistor 236 biased on. Transistors 236 and 237 are designed such that with both enabled and conducting, the voltage appearing on conductor 233 is close to ground, a "0". This is accomplished by designing transistor 237 to have less resistance than transistor 236. Typically this result is achieved by making transistor 236 physically larger than transistor 237.

During each 40 millisecond time period, AM or FM decode circuit 209 or 210 provides fifteen output "1" or "0" signals to the D-input of flip-flop 216 through transistors 211 and 212, respectively. These signals appear at the Q-output of flip-flop 216 and serve as the third input to AND gate 219. Assuming that the noise level of FMTIC is at or below a presented acceptable level and that conductor 232 is at a "1" level, then these signals on the third input of AND gate 219 are essentially transported to the output of AND gate 219 and become input signals to persistence counter 229. During any given 40 millisecond time period persistence counter 229 receives fifteen "1" or "0" input signals from AND gate 219.

A count of eleven (11) or less "0" input signals to persistence counter 229 in a 40 ms time period results in the output of decode circuit 231 being a "0". This "0" on conductor 272 results in conductor 232 being a "1" because of the inversion introduced by inverter 240. This maintains AND gate 219 enabled. It also disables AND gate 235 and thereby causes the output thereof, which is the SOS 120 output terminal that is coupled to conductor 128 that is also coupled to microprocessor 119, to be a "0". This "0" input on conductor 128 causes microprocessor 119 to reject the radio signal candidate tested within the last 40 ms time period and causes it to adjust receiver 100 to receive another candidate radio channel (signal) and to test that channel (signal) to see if it is acceptable. A count of twelve (12) or more "1" input signals to persistence counter 229 in a 40 ms time period results in the output of decode circuit 231 being set to a "1" level. A "1" level on conductor 272 results conductor 232 being at a "0" level which disables AND gate 219. This prevents the persistence counter 229 from resetting to a zero state before occurrence of the 40 ms reset signal applied by microprocessor 119 to the conductor 117.

The comparator circuit 234 generates a "1" on conductor 278 if the output signal level of AGC circuit 118 is greater than the AGC Ref signal level. If the reverse is true, the output of comparator circuit 234 is a "0". A "0" on conductor 278 disables AND gate 235 and results in a "0" on the conductor 128.

If during the 40 ms time period a candidate radio signal is evaluated, the output of decode circuit 231 is a "1" and the output of comparator 234 is a "1", the AND gate 235 generates a "1" onto conductor 128. This "1" on the conductor 128 causes microprocessor 119 to lock onto the candidate radio signal just evaluated and to allow same to be listened to. If the output of decode circuit 231 or the output of comparator 234 is a "0", then a "0" is generated on the conductor 128. This "0" on the conductor 128 causes microprocessor 119 to reject the candidate radio signal just evaluated and to reconfigure portions of receiver 100 so as to allow another candidate radio signal to be evaluated.

Accordingly, radio receiver 10 accepts and allows listening to a candidate radio signal if that signal passes frequency tests, field strength tests, and in the case of FM signals, a noise test.

It is to be understood that the specific embodiments described herein are intended merely to be illustrative of the spirit and scope of the invention. Modifications can readily by made by those skilled in the art consistent with the principles of this invention.

The embodiments of the invention in which an exclusive property or privilege is claimed are defined as follows:

1. A radio receiver comprising:
   a stop on station circuit comprising:
   field strength measuring means for evaluating received station signals for signal strength and for generating corresponding field strength pass output signals;
   frequency measuring means for evaluating received station signals for correct frequency and for generating corresponding frequency pass output signals;
   said frequency measuring means comprises clock means for defining evaluation time periods and a plurality of sampling time periods within each evaluation period, measuring means for measuring the frequency of a received station signal in each of said sampling time periods for generating sample pass output signals, persistence evaluation means for counting the number of said sample pass output signals received during each evaluation time period and for generating said frequency pass signals if the number of counts in an evaluation time period equals or exceeds a defined threshold value;
   said frequency measuring means further including gating means for gating said sample pass output signals to said persistence evaluation means;
   noise measuring means for evaluating the level of ultrasonic noise in demodulated received station signals and for generating corresponding noise pass and no pass signals for respectively enabling and disabling said gating means;
   decision means comprising second gating means responsive to said field strength pass and said frequency pass signals for generating corresponding stop on station signals.

2. A radio receiver of claim 1 wherein:
   said sample measuring means comprises:
   a digital counter for counting the zero crossing in a receiver IF signal during a sample period and for generating corresponding count output signals; and
   decoding means for decoding the count output of said counting means for generating said sample pass signals if the count signals are within a predetermined range of counts.

3. The radio receiver of claim 1 wherein said radio receiver is an AM/FM receiver and wherein said decoding means comprise independent AM decoding means and FM decoding means; wherein AM/FM selection signals select between said AM and FM decoding means.

4. The radio receiver of claim 3 wherein said noise measuring means provides a noise pass signal whenever said receiver is in an AM mode.

* * * * *